US008893048B2

(12) United States Patent
Gupta

(10) Patent No.: US 8,893,048 B2
(45) Date of Patent: Nov. 18, 2014

(54) SYSTEM AND METHOD FOR VIRTUAL OBJECT PLACEMENT

(76) Inventor: Kalyan M. Gupta, Springfield, VA (US)

(*) Notice: Subject to any disclaimer, the term of this patent is extended or adjusted under 35 U.S.C. 154(b) by 41 days.

(21) Appl. No.: 13/468,221

(22) Filed: May 10, 2012

(65) Prior Publication Data

US 2012/0290987 A1  Nov. 15, 2012

Related U.S. Application Data

(60) Provisional application No. 61/485,680, filed on May 13, 2011.

(51) Int. Cl.
*G06F 3/0481* (2013.01)

(52) U.S. Cl.
CPC ................... *G06F 3/04815* (2013.01)
USPC ........................................................ 715/848

(58) Field of Classification Search
USPC ................................ 715/848, 706, 782
See application file for complete search history.

(56) References Cited

U.S. PATENT DOCUMENTS

| | | | | |
|---|---|---|---|---|
| 4,706,121 A * | 11/1987 | Young | | 348/27 |
| 5,050,090 A | 9/1991 | Golub et al. | | |
| 5,535,134 A | 7/1996 | Cohn et al. | | |
| 5,745,710 A * | 4/1998 | Clanton et al. | | 725/60 |
| 5,774,122 A * | 6/1998 | Kojima et al. | | 715/848 |
| 6,331,877 B1 * | 12/2001 | Bennington et al. | | 348/731 |
| 6,463,468 B1 * | 10/2002 | Buch et al. | | 709/219 |
| 6,530,082 B1 * | 3/2003 | Del Sesto et al. | | 725/9 |
| 6,973,436 B1 * | 12/2005 | Shkedi | | 705/14.44 |
| 7,168,084 B1 * | 1/2007 | Hendricks et al. | | 725/42 |
| 7,207,053 B1 * | 4/2007 | Asmussen | | 725/42 |
| 7,743,330 B1 * | 6/2010 | Hendricks et al. | | 715/723 |
| 8,117,635 B2 * | 2/2012 | Hendricks et al. | | 725/34 |
| 8,350,844 B2 * | 1/2013 | Sharp et al. | | 345/419 |
| 8,677,358 B2 * | 3/2014 | Evans et al. | | 718/1 |
| 2002/0105533 A1 * | 8/2002 | Cristo | | 345/706 |
| 2002/0112249 A1 * | 8/2002 | Hendricks et al. | | 725/136 |
| 2003/0174178 A1 * | 9/2003 | Hodges | | 345/848 |
| 2007/0070038 A1 | 3/2007 | Hoffberg et al. | | |
| 2009/0222358 A1 * | 9/2009 | Bednarek | | 705/27 |
| 2010/0030578 A1 * | 2/2010 | Siddique et al. | | 705/3 |
| 2013/0111367 A1 * | 5/2013 | Park et al. | | 715/757 |

OTHER PUBLICATIONS

Ken Xu et al.; Constraint-based Automatic Placement for Scene Composition; May 2002; University of Toronto; 1-10.*

(Continued)

*Primary Examiner* — Phenuel Salomon
(74) *Attorney, Agent, or Firm* — Williams Mullen, PC; Thomas F. Bergert

(57) ABSTRACT

A computer system and method according to the present invention can receive multi-modal inputs such as natural language, gesture, text, sketch and other inputs in order to manipulate graphical objects in a virtual world. The components of an agent as provided in accordance with the present invention can include one or more sensors, actuators, and cognition elements, such as interpreters, executive function elements, working memory, long term memory and reasoners for object placement approach. In one embodiment, the present invention can transform a user input into an object placement output. Further, the present invention provides, in part, an object placement algorithm, along with the command structure, vocabulary, and the dialog that an agent is designed to support in accordance with various embodiments of the present invention.

19 Claims, 6 Drawing Sheets

(56) References Cited

OTHER PUBLICATIONS

Baykan, C.A., Fox, M.S. Constraint Satisfaction Techniques for Spatial Planning, Intelligent CAD Systems III, Practical Experience and Evaluation, P.J.W. ten Hagent and P.J. Veerkamp (eds.)—Springer-Verglag: Berlin, Germany pp. 187-204, 1991.

Charman, P. Solving Space Planning Problems Using Constraint Technology. NATO ASI constraint programming, Student presentation TR CS 57/93, Institute of Cybernetics, Estonian Academy of Sciences, Tallinn, Estonia, pp. 80-96, 1993.

Dewar, R.G., Carpenter, I.D., Ritche, J.M., Simmons, J.E.L. Assembly Planning in a Virtual Environment. IEEE conference on Innovation in Technology Management—The Key to Global Leadership. PICMET '97: Portland International Conference on Managment and Technology, pp. 664-667, 1997.

Cosgun, A., Hermans, T., Emeli, V., Stilman, M. Push Planning for Object Placement on Cluttered Table Surfaces, IEEE/RSJ International Conference on Intelligent Robots and Systems (IROS), San Francisco, USA, Sep. 2011.

Xu, K., Stewart, J., and Fiume, E. 2002. Constraint-based automatic placement for scene composition. In the Proceedings of Conference and Graphics Interface 2002.

International Search Report and Written Opinion for PCT/US12/37420, USPTO, Aug. 13, 2012.

International Preliminary Report of Patentability for PCT/US12/37420, USPTO, Nov. 15, 2013.

\* cited by examiner

SYSTEM AND METHOD FOR VIRTUAL OBJECT PLACEMENT

REFERENCE TO RELATED APPLICATIONS

This application claims the benefit of U.S. patent application No. 61/485,680, entitled "System and Method for Virtual Object Placement" filed May 13, 2011.

FIELD OF THE INVENTION

The present invention relates to virtual object manipulation, and more particularly to virtual object manipulation using multi-modal inputs, including where instructions provided via any of the inputs are underspecified.

BACKGROUND OF THE INVENTION

Object placement or layout design is a vital component of many practical software applications. Background layout in animated movies, video game map development, crime or accident scene simulation, interior design applications (e.g., home design software) and computerized virtual graphical social spaces such as Second Life™ are examples of applications that require various object placement functions to be carried out.

Such applications typically require arduous manipulation of graphical objects in the virtual world by means of a mouse or other input devices. For example, one might place multiple block objects in an axis aligned manner in a 2D virtual world using a constraint satisfaction algorithm. However, there is currently no ability for an application to understand and act upon a designer's command, such as, "Put the wardrobe in that corner", which uses a combination of natural language and gesture.

It will be appreciated that a computer system that can receive multi-modal inputs such as natural language, gesture, text, sketch and other inputs in order to manipulate graphical objects in a virtual world would provide desirable results.

It will further be appreciated that a computer system that can accurately manipulate graphical objects in a virtual world upon receiving multi-modal inputs that underspecify the user's instructions would provide desirable results.

SUMMARY OF THE PRESENT INVENTION

The present invention provides a computer system and method that can receive multi-modal inputs such as natural language, gesture, text, sketch and other inputs in order to manipulate graphical objects in a virtual world. As such, the present invention can facilitate use of, and interaction with, virtual worlds. For example, children and non-expert adults can employ the present invention to interact in virtual environments which would otherwise be too complex. Additionally, individuals with various physical limitations (e.g., those who cannot work with an electronic mouse) can employ multiple alternative input components in order to interact and manipulate objects in a virtual environment.

In one embodiment, the present invention can be employed to transform natural language or text instructions for object assembly or disassembly into 3D visualizations. Such visualizations can include, for example, new product assembly visualizations, or other self help, maintenance and/or repair visualizations. For example, toy manufacturers and furniture retailers can employ the present invention to generate visualizations of product assembly steps in order to provide customers with better options beyond static instruction sheets, customer service calls and online do-it-yourself websites with information such as videos purporting to assist product purchasers with assembly and other product operations.

The present invention provides, in part, an approach for implementing a Communicative Agent for Spatio-Temporal Reasoning (called CoASTeR™, in one embodiment) that responds to multi-modal inputs (e.g., speech, gesture, and sketch) to simplify and improve object placement in virtual worlds, among other tasks. In one embodiment, the present invention includes a software system workbench implementing one or more agents associated with the present invention. The components of an agent as provided in accordance with the present invention can include one or more sensors, actuators, and cognition elements, such as interpreters, executive function elements, working memory, long term memory and reasoners for object placement approach. In one embodiment, the present invention can transform a user input into an object placement output. Further, the present invention provides, in part, an object placement algorithm, along with the command structure, vocabulary, and the dialog that an agent is designed to support in accordance with various embodiments of the present invention.

The present invention further provides a system and method for manipulating objects in virtual worlds, including three-dimensional virtual worlds with many constraints and rules in a non-axes aligned manner (i.e., the edge of the objects need not be perpendicular or parallel to each other). The present invention can further place individual objects without simultaneously solving location placement problems for multiple objects. The objects can be heterogeneous, such as chairs, tables, books, electronic devices, etc. In one embodiment, steps and/or rules used in accordance with the present invention can be formulated as a multi-level constraint satisfaction problem. For example, the first step would be to solve the most probable activity station, and the second step would be to solve for most probable placement and orientation. Alternatively, the present invention can employ a customized attractor/repulser algorithm for increased speed. The present invention further employs requesting agent characteristics with reachability, intent and visibility parameters. The present invention can also be employed within a cognitive architecture and can adapt to linguistic input.

DETAILED DESCRIPTION OF EMBODIMENTS OF THE PRESENT INVENTION

Figure 1:
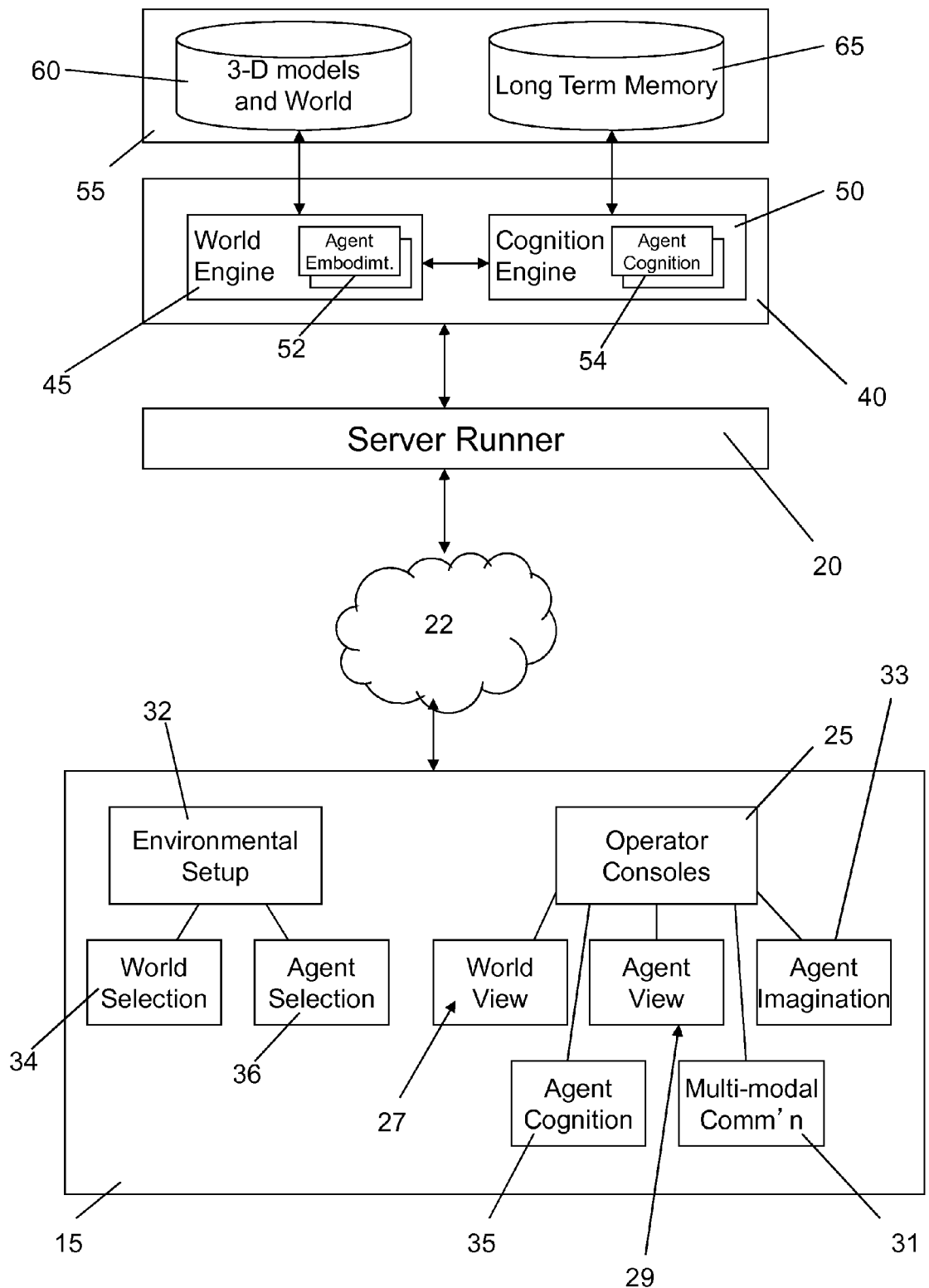
FIG. 1 shows one embodiment of a system architecture employed by the present invention.

As shown in FIG. 1, the system 10 of the present invention can be implemented in a modular client server architecture, with different sets of plug-and-play components, including one or more operator clients 15, access server runner 20, engine 40 and knowledge bases 55. The system of the present invention is a computer-based system, where the components can be implemented in hardware, software, firmware, or combinations thereof. It will be appreciated that the system of the present invention incorporates necessary processing power and memory for storing data and programming that can be employed by one or more processors to carry out the functions and communications necessary to facilitate the processes and functionalities described herein. In one embodiment, the components, sub-components and/or modules associated with the present invention can be implemented using object oriented languages such as C++ or Java using well defined software interfaces such that the implementation of any component can replaced by another with equivalent functionality without affecting the overall functionality of the workbench. It will be appreciated that access can be provided over a public or private network 22, including the Internet, in various embodiments of the present invention. The present invention can comprise, in one embodiment, computer program instructions for receiving one or more inputs, determining a valid and/or optimal location for a virtual object in a virtual world and placing the object in the virtual world according to the determination. The computer program instructions can also perform the other processes and algorithm elements described hereinafter. The computer program instructions can be embodied in a computer readable medium, which can be any data storage device capable of storing data which can thereafter be read by a computer or computer system. Example such devices are hard drives, network storage, read-only memory (ROM), random access memory (RAM), compact discs, magnetic tapes, portable storage devices such as flash drives, and other optical and non-optical data storage devices. The computer readable medium can also be distributed over a network-connected computer system to allow the computer program instructions to be stored and executed in a distributed manner. Computers and/or computer systems capable of employing the present invention include mobile communication devices and other microprocessor-based devices, as well as minicomputers, mainframe computers and networked computers, for example.

With reference to FIG. 1, the operator client 15 comprises the user interface layer of the architecture of the system 10 of the present invention, and includes interaction consoles 25 such as World View console 27 and Agent View console 29. The World View 27 console permits the user to interact with the virtual environment selected by the user, and the Agent View console 29 permits the user to interact with one or more agents that will then be employed in the virtual environment. The consoles 25 can further include input/output (I/O) devices shown generally at 31 to promote multi-modal communication, including devices such as a graphical user interface (GUI) with a text input chat, a headset with microphone to provide speech input, a sketch device such as an iPad™, gesture input device such as Microsoft Kinect™ or Nintendo Wii™, and a display screen such as those provided by a computer, television or other display unit. It will be appreciated that all I/O devices may not be included in particular implementations of the present invention. The consoles 25 can further include agent imagination console 33 and agent cognition console 35. These consoles 33, 35 can permit a user to view the traces of reasoning algorithm operation so as to, for example, identify potential reasoning errors. These consoles can further be used to identify the root causes of unexpected behavior, and apply adjustments to correct such behavior.

The Server Runner 20 enables the workbench of the present invention to operate in a client server mode, where multiple operator clients 15 can either locally or remotely connect to the engine 40 of the present invention. The engine 40 is the core of the system 10 of the present invention and, as shown in the embodiment of the invention represented by FIG. 1, comprises a World Engine 45 and a Cognition Engine 50. The World Engine 45 is adapted to interact with third party components (not shown) such as, for example, a game engine application programming interface (API) or a 3-D graphics engine API (e.g., Object-Oriented Graphics Rendering Engine ("OGRE")). An agent's physical representation or its embodiment 52 resides in the World Engine 45. Through its embodiment API, the agent can perceive or sense the virtual world in which it interacts, gather information about the objects, including their position and movements, for example, and create events or actions that change the world. The communicative abilities and programming of the present invention can be embedded in any existing 3-D graphical software application that provides a suitable API to access and manipulate the contents of the virtual world. For example, the present invention can interact with OGRE, a 3-D graphical rendering engine. The Cognition Engine 50 houses an agent's reasoning and/or its cognitive ability 54, as described in more detail below.

The Knowledge Base layer 55 includes a variety of data and knowledge that can be employed in the system of the present invention. For example, programmed models for spatial reasoning, gesture models, parameters for the object placement algorithm in the Long Term Memory of the present invention, and programmed graphical object models to retrieve and place in the virtual world can be stored in the Models and World Knowledge Base 60. Long Term Memory knowledge base 65 can store dictionaries, grammar rules, semantics and knowledge bases (such as outlined below), for example.

The Environmental setup component 32 of operator client 15 can include a world selection sub-component 34 and an agent selection sub-component 36 for permitting the user to select a virtual world and an agent to act within the selected virtual world.

Figure 2:
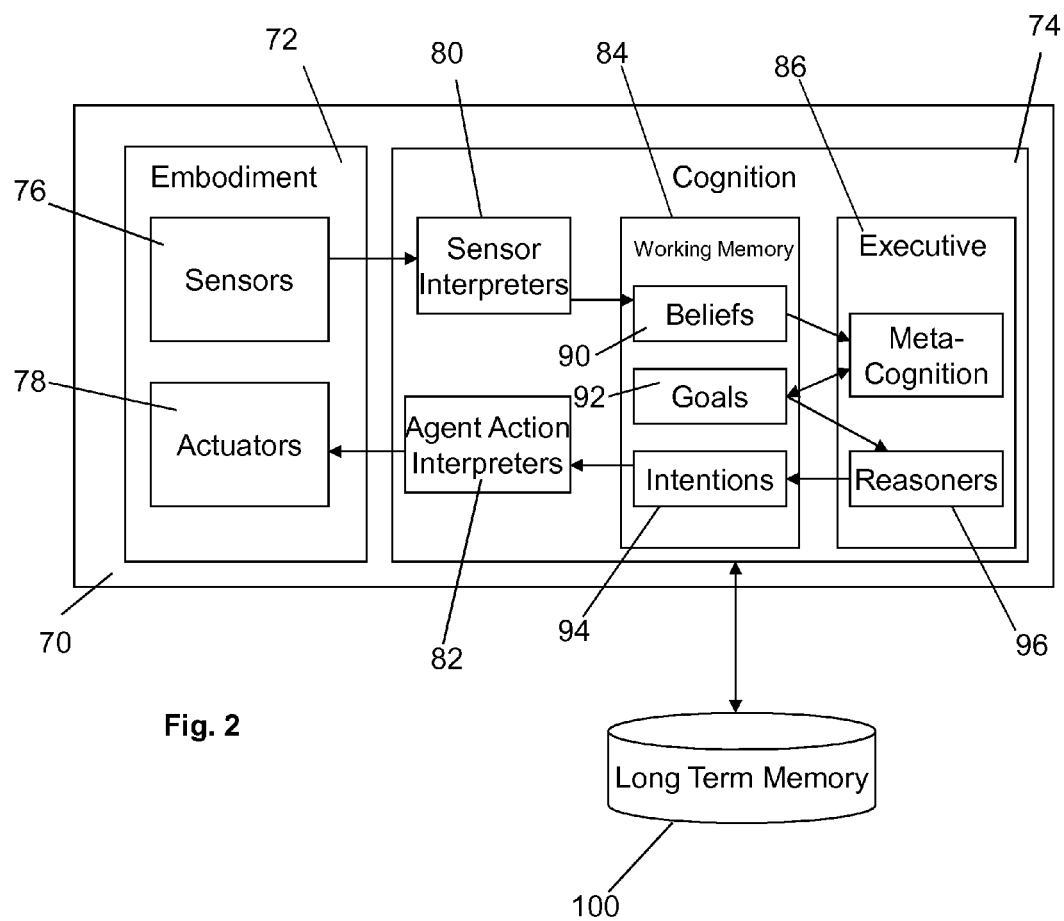
FIG. 2 shows one embodiment of an agent architecture employed by the present invention.

FIG. 2 shows one embodiment of the cognitive architecture 70 for an agent in accordance with the present invention. The architecture in FIG. 2 includes the Embodiment or physical representation component 72 and the Cognition component 74, which are referred to above in connection with the World Engine 45 and Cognition Engine 50, respectively. The Embodiment component 72 comprises the physical component of the agent and its connection to the virtual world. It comprises a Sensor sub-component 76 and an Actuator sub-component 78. The Sensor sub-component 76 includes sensors that can gather information from the virtual world. For example, a visual sensor extracts the scene graph of objects located in the graphical world for further processing. As a further example, speech recognition software (e.g., Sphinx™ or Dragon™) embedded in the speech sensing module translates a speech utterance into a text form suitable for further processing by the agent. Other sensors can include, for example, text, gesture and sketch sensors. The Actuator sub-component 78 delivers executable action to the virtual world. For example, a piece of text can be transformed into a speech signal by an interpreter and sent to a speaker, or an action script can be transformed into an agent animation. Actuator functions can include, for example, imagination, manipulator, locomotion and agent sensor actuation. For example, the locomotion capability of a virtual agent can be provided by two wheels powered by independently driven motors or actuators. Power of force can be applied to these wheels via the motors using physical simulation provided by a physics engine. In one embodiment of the present invention, a physics engine such as the open source engine, Bullet™, is employed.

Figure 3:
FIG. 3 shows an exemplary screen display of a representational language representation of a linguistic placement command in accordance with one embodiment of the present invention.

The Cognition component 74 provides the various cognitive abilities for the agent and interfaces with the Embodiment component 72. In one embodiment of the present invention, the Cognition component 74 comprises the Sensor Interpreters sub-component 80, the Action Interpreters sub-component 82, the Working Memory sub-component 84 and the Executive sub-component 86. The Sensor Interpreters sub-component 80 comprises interpreter elements that are adapted to transform raw sensory inputs such as text, scene graphics, and gesture signals into a logical form or "mentalese." Logical forms are specialized computational representations that can be processed by reasoners or inference engines (e.g., first order logic). Given the diversity of logic languages such as first order, second order or higher order logics, the present invention can employ, in one embodiment, its own internal representation language called CRL (which stands for CoASTeR Representation Language). CRL is the present invention's canonical method for exchanging data across the agent sub-components. In one embodiment of the present invention, the syntax and the conventions of CRL are based on the ontologies and knowledge base associated with CycL developed by Cycorp, Inc. of Austin, Tex., in order to support its wide compatibility and acceptability among users. The present invention can include the following language components, for example: predicates, entities, logical connectives, types, modal operators, and other higher-order relations, as shown in the exemplary screen display 105 of FIG. 3.

The Working Memory sub-component 84 is adapted to include a version of the Belief Desires and Intentions software model (BDI model) as part of the working memory. Beliefs 90 contain facts about the world as perceived by agents of the present invention. The Goals 92 are high level objectives that the agent must accomplish and the Intentions 94 are planned commitments to achieve the Goals.

The Executive sub-component 86 orchestrates the functioning of all of the other components in the agent's cognition. For example, the Executive sub-component 86 sets the goals and activates the reasoners to plan, schedule, and prioritize actions. The Executive sub-component 86 includes a meta-cognition component 95 that can receive information from the Beliefs element 90 and exchange information with the Goals element 92. A principal task of the meta-cognition component 95 is to, based on the sensed situation, set and prioritize goals to perform. For example, when a command to place an object is received from the text input, the meta-cognition component's goal setting algorithm can post an object placement task in the agent's belief base. The reasoners 96 include a set of swappable components that can take CRL representations of the virtual world and decide and develop an action response for the agent, for example. Reasoners can include, for example, path planners that help the agent decide how to move from one location to another or an object placement component that helps the agent decide where to place a new object in the world. In one embodiment of the present invention, the reasoners output their decisions in CRL mentalese, which is then handed off to the Action Interpreters component 82 via Intentions element 94 for further processing. The Action Interpreters component 82 is adapted to transform the CRL mentalese into executable information. For example, a language interpreter can transform a logical form representation of what an agent needs to say into a text form. Alternatively, a scene interpreter can transform a placement decision into a scene graph.

The Long term memory 100 of an agent comprises a variety of knowledge resources needed by the interpreters and generators. Such knowledge can include, for example, the lexicon for interpreting natural language or knowledge about objects in the world.

Exemplary Object Placement

Consider an interior design application where an end user interacts with the system 10 of the present invention using client 15. The interior design application can be accessed via the World Engine 45 of engine 40. In this example, the user can be presented with a view of an office space on his or her computer screen or monitor. Further, consider two possible scenarios of interaction. The first scenario involves only one modality of input. In this scenario, the user speaks an object placement command into a microphone "Place the printer on the table." The second scenario involves two modalities of input; speech and gesture. In this scenario, the user speaks a slightly different command into the microphone "Place the printer over there" and points to the table using a controller such as a Wii™ remote or a finger (when the system is connected with Kinect™ or similar gesture sensing system). An agent in accordance with the present invention can transform each of these inputs into a concrete placement action as described below.

In the first example, a speech recognizer component associated with the operator consoles 25 of client 15 transforms the speech signal into a string of words or text. The present invention can use, in one embodiment, an open source speech recognition system (e.g., Sphinx™) along with a handcrafted dictionary and grammar covering the range of inputs expected in a particular application. The dictionary and the grammar are stored in the agent's Long Term Memory 100.

In the second scenario, when the end-user also interacts with the gesture modality by pointing to the table, a gesture recognizer component associated with the operator consoles 25 of client 15 can transform the pointing gesture signal into a location in the image displayed on the user's monitor. In one embodiment of the present invention, a remote such as a Wii™ remote can be used for identifying where the user is pointing. As the speech and gesture inputs are being concurrently processed, the visual sensor associated with the Embodiment component 72 of the agent extracts the scene graph from the virtual world based on the user's perspective (i.e. the displayed scene). In one embodiment of the present invention, the scene graph comprises the set of objects in the display, their graphical elements such as surfaces, mesh elements, and relative positions. For example, a table can be an object, and the table has graphical elements such as a top surface, bottom surface and edges, with relative positions such as "on the floor" and "in front of the wall".

Further processing according to one embodiment of the present invention can include a language interpreter as part of the sensor interpreter component 80 receiving the text input and transforming it into a logical form in CRL format. An open source semantic interpreter called OpenCCG can be used for this purpose, for example. The interpreter can use its own handcrafted dictionary of terms, grammar rules, and predicate semantics (i.e., meaning units) to cover the range of inputs expected in an application domain, described below. This lexicon is stored in the agent's long term memory 100 and loaded when the agent becomes ready for action. The interpreted logical form of the user utterance is posted in the working memory 84 for further processing by the agent's reasoning components 96.

In the second scenario, where the gesture input is included as well, the gesture interpreter associated with sensor interpreter component 80 receives the image location output by the gesture recognizer and selects an object and its surface for potential placement. For example, it selects the table as the object, its top surface and a potential region on the table for placement on the surface. This information about object, surface, and placement region is posted in the working memory 84.

A scene interpreter associated with the sensor interpreter component 80 receives the scene graph as the input and computes a variety of qualitative spatial relations and object features. In one embodiment of the present invention, the scene interpreter uses programmed spatial computation models according to the present invention stored in the agent's long term memory to compute these relations. For example, the scene interpreter can compute whether two 3-D objects are touching, how far apart they are, and their relative orientations. If, for example, the present invention needs to compute the distance between two surfaces, each belonging to a different object, the scene interpreter can do so by (1) placing a grid on each surface; (2) computing the distance between the center point of a cell in one grid and that of a cell in another grid; and (3) performing the same computation in (2) for all possible cell pairs between the two surfaces. Then, the scene interpreter can pick the minimum distance. If the minimum distance is 0, then the two objects are touching each other. Based on the object properties loaded from the agent's long term memory, the scene interpreter can also associate meaning to various graphical objects. For example, it knows that a set of polygons comprise a table. The scene interpreter can thus transform this information into the CRL format and post it in the working memory 84.

The Reasoners 96 poll the working memory for the CRL outputs provided by the Language, Gesture, and Scene Interpreters described above. For example, a Situation Understanding Reasoner can unify the various representation elements by unifying the table entity identity from the Language Interpreter with the table entity identity in the scene. When gesture is involved as described above in the second scenario, the Situation Understanding Reasoner can unify the table entity from the scene interpreter with the gesture object. As a result, a fully grounded CRL representation of the current state of the world is derived. This representation can be posted back into the working memory for subsequent processing. Using the unified CRL situation representation, the object placement algorithm of the present invention can compute the location and the orientation of the new object and pass it on to a Scene Generator component associated with actuators 78.

The Scene Generator can retrieve a graphical model of the new object (e.g., the printer) from its long term memory and insert the new object into the existing scene graph at the location computed by the object placement reasoner. The end user sees the result of the action on the World View Console provided as part of the client 15 of the present invention.

Object Placement Commands Structure, Vocabulary, and Dialog

The Object Placement Reasoner can process and respond to a variety of object placement commands. In one embodiment of the present invention, the present invention assumes English is used as the language for commands. However, other natural languages could be used as well with suitable changes to speech recognition and language understanding lexicons. The command structure can include a combination of the following elements:

1. Placement command verb: This refers to a placement command such as "put" "place", and "insert", for example.
2. Target object to be placed: This may include common terms referring to objects, such as printer, pen, monitor, available to the user in the application of interest. When used in combination with gesture, the object may be referred by pronouns such as "this", "that", "it", etc. In linguistics, this is called a diectic reference. The vocabulary of the agent covers the range of objects to be supported by the agent in accordance with the present invention.
3. Landmark object(s) and its associated regions: Landmark objects are reference objects in the virtual world in relation to which the target objects are placed. For example, in the directive "Put the printer on the table", the table is the landmark object and the printer is the target object. An example of region landmark expression is "corner of the table" where corner is the region selecting attribute of the table. When gesture is used, this can be referred by pronouns such as "this" and "that" and "there". In one embodiment of the present invention, a user can use multiple landmarks for precisely locating a target object. For example, in the command, "Place the printer on the table next to the monitor", two landmarks, the table and the monitor, are used along with two linguistic spatial relations "on" and "next to". Although the algorithm according to embodiments of the present invention can handle multiple landmark commands, users may typically provide few landmarks, which the present invention can also accommodate.
4. Linguistic spatial relation: These include prepositions (e.g., in English) and other spatial terms that refer to the spatial relation of the target object with the landmark. For example, these include "on", "in", "between", "onto", "into", "before", "after", "next to", "close to", "away from", "near", "behind", "in front of", "left of", "right of", "across", "over", "above", "under", "beneath", "adjacent to", etc. In one embodiment of the present invention, such as when the user has a precise placement for an object in mind, the user can specify the precise distance and orientation from the landmark. For example, "Three feet from the monitor" includes distance as a spatial relation. Likewise, "facing the chair" includes a relative orientation of the target with respect to the landmark. Examples of various orientation terms (e.g., in English) include, "facing", "face to face", "shoulder to shoulder", and "side by side".

Below are examples of object placement commands with the above four command structure elements:

"Put the printer on the table."
"Put that on the table."
"Put it on the table."
"Put it on the corner of the table next to the monitor."
"Put the printer on the shelf above the table."
"Put the printer on the table 3 feet from the edge of the table."

"Put it on the table 3 feet from the edge of the table facing the lamp."

The present invention can thus adapt to a variety of spoken commands of different degrees of specificity.

Dialog

In the course of interpreting the user commands, agents in accordance with the present invention may encounter ambiguity or interpretation failure. For example, when multiple tables are present in the scene, the agent may not be able to correctly identify the table being referred to by the user. Alternatively, interpretation failure may occur if the object being referred to is not available in the agent's memory. For example, in the command "Place the rack next to sphygmomanometer" the agent may not know what a sphygmomanometer is. To resolve such ambiguities and interpretation failures, the agent can employ the operator console 25 to engage in a dialog with the end user according to one embodiment of the present invention. For example, it can query the user "Which table do you mean? The one on your right or the one on your left?" The answers to such queries can be used to resolve ambiguities in accordance with the present invention.

Figure 4:
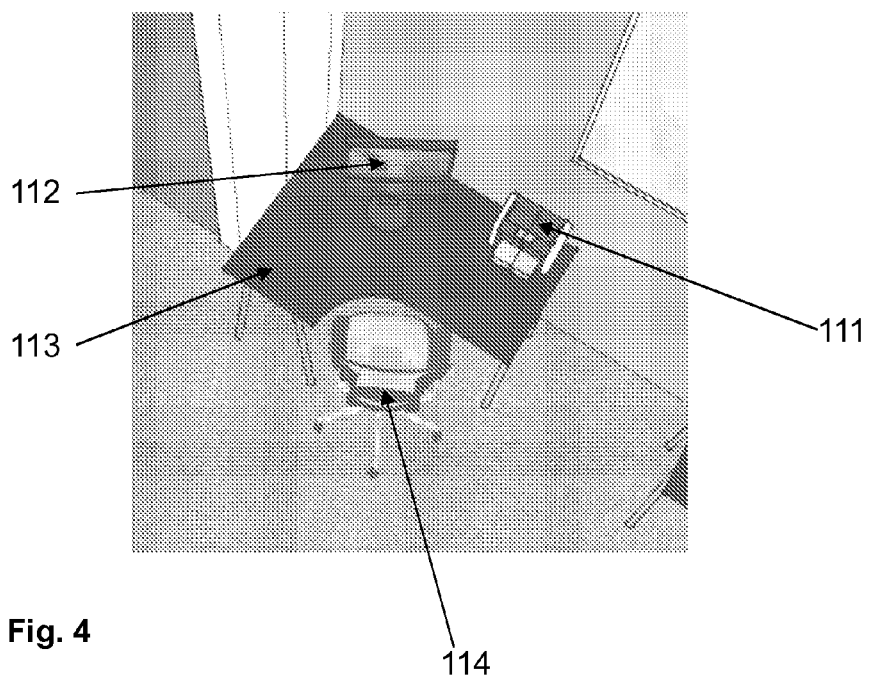
FIG. 4 shows an example rendering of objects within a virtual environment in accordance with one embodiment of the present invention.

As a separate example, consider the task of imagining a scene described by text utterances or equivalently generating a static scene in a virtual environment. For example, imagine "a chair in front of the table" and subsequently imagine a "printer on the table." An example desired rendering of the scene is shown in FIG. 4, with printer 111, monitor 112, table 113 and chair 114.

The central issue addressed by the present invention in such a task is interpreting the rather vague spatial prepositions such as "on" and "in-front-of" into valid and acceptable object placements. The utterance "printer on the table" can only be judged as vague when attempting to place the printer in an existing virtual world. For instance, the placements on the table could be to the left, right, front, and behind a monitor that already exists on the table. However, the placements in front and back of the monitor are functionally unacceptable for a human user. The utterance also does not specify the suitable orientation of the printer. Without such a specification, the printer 111 could be oriented in numerous ways in relation to a monitor 112 and the chair 114, only some of which would be valid. For example, the orientation shown in FIG. 4 is valid. However, the orientation of printer with its back to the user would be invalid.

In accordance with the present invention, functional knowledge of interaction between objects is considered for generating valid placements. The present invention incorporates a determination of what the content of such functional and world knowledge should be, and how it can be utilized to recover any unspecified elements and generate a complete and valid specification of object placement.

In one embodiment of the present invention, the virtual world is identified as W, and the set of objects in the world is identified as O. Given W, and with O located in various places within W, and further given an underspecified linguistic command issued by the requesting agent ($a^r$) to place a target object, $o^t$ in W, the present invention can find valid locations and orientations for the target object, and can then place the object in W. It will be appreciated that a fully specified location command may be one, for example, that details specific x and y coordinates for the placement of an object. The present invention can work with such fully specified commands, but also adapts to underspecified commands that require interpretation as described herein.

In one embodiment of the present invention, an algorithm is employed that incorporates one or more of the following steps:

Prepare Inputs

The present invention prepares the inputs by retrieving a linguistic placement constraint (lpc), identifying the requesting agent's ($a^r$s) intent, and retrieving the $a^r$ preference as follows:

a. Obtain the lpc: The present invention's Language Interpreter interprets a linguistic command such as "Put the book on the table" and places its semantic interpretation in CRL format in the agent's belief base (BB). The linguistic command can be received by voice or text input, for example, and can be interpreted in CRL format by the Language Interpreter as part of sensor interpreter component as described above and shown in FIG. 2. The agent's belief base is maintained within working memory as described above and shown in FIG. 2. As part of this step, the linguistic placement constraint is retrieved from long term memory for further processing. At this stage, the present invention can also mark all potential relationships between agents in the world, the target object $o^t$ and the landmark objects ($o^l$). The present invention can perform this by looking up an Agent-Object-Relation Database (AOR-DB), described below. For example, the phrase "my book" associates the $o^t$ with a $a^r$ and the phrase "his table" would link the table to another agent in the world.

b. Obtain intent (i) for $a^r$: The present invention can identify the intent associated with agent $a^r$ and with lpc as the input parameter as follows. The present invention retrieves the type of object expressed as the landmark or container in lpc and retrieves the intent associated with it from an object knowledge base (O-KB) associated with the present invention. For example, the object "kitchen sink" has a default intent of "maintenance", and the object "shelf" has a default intent of "storage" associated with it.

c. Obtain placement preference(s) (pp) for $a^r$: The present invention can then retrieve the $a^r$ placement preference such as "right handed" or "left handed" from the agent knowledge base (A-KB).

Obtain Object Properties (op) for $o^t$

Once the inputs are prepared, the present invention can retrieve the op from the object knowledge base (O-KB) using the semantic category of the target object $o^t$ as the input query. For example, the semantic category can be a "book" or a "table".

Obtain Candidate Placement Surfaces (cps)

Using the lpc, the present invention can identify $o^{lpc}$ as all the objects associated with the landmark objects ($o^l$) covered by the lpc. The present invention can then identify all the surfaces associated with $o^{lpc}$. Next, the present invention can filter the surfaces based on criteria. In one embodiment, the present invention filters the surfaces based on the following criteria: 1) surface outside normal, 2) height of the surface from the floor, and 3) installability of the target object $o^t$. The present invention can apply the following rules, for example, to select the cps: 1) If $o^t$ is not installable, the present invention ignores all surfaces whose outside normal vector is not pointing upwards. 2) The present invention ignores any surface that is located outside the range of $o^t$s height preference. 3) The present invention ignores a surface if its largest dimension is smaller than the smallest dimension of the target object.

Obtain Candidate Activity Surfaces (cas)

An activity surface is one on which the requesting agent $a^r$ is located while interacting with other candidate objects. For example, this may be a floor, or furniture such as a seat. The cas's are those surfaces that are within $a^r$'s reachable distance from the cps. Reachable distance can vary based upon the agent type, as described below.

Obtain Relevant Object Identities and Categories (roic)

For all the surfaces in cps and cas, the present invention identifies all the objects that are in contact with these surfaces. The present invention then recursively identifies all the objects that are in contact with the objects thus far identified. Once all the objects are identified, the present invention identifies their categories as well retrieves placement constraints associated with the type of an object.

Obtain Relevant Object Activity Station Relations (roasr)

Activity stations are locations in the world where an agent may be located while interacting with an object. In this step, for every object in roic, the present invention identifies whether it is an activity station (as), how many objects of the type are allowed in a particular activity station (i.e., the object per station cardinality constraint), and whether it is a self-category attractor. The present invention does this by looking up a record in the object knowledge base (O-KB). For example, a chair is an activity station, and a book is not; and typically, only chair may be placed per activity station, but many books may be placed per activity station. Furthermore, a book attracts other objects of its own type.

Obtain Relevant Inter Object Activity Station Constraints (rioasc)

Certain objects may be co-located within the reach of the same activity stations, while others may not. In this step, for each pair of objects in roic, the present invention retrieves an object to object activity and distance record from the Object to Object Activity and Distance Constraints Knowledge-Base (OOADP-KB) whether they preferably belong to the same activity station or a different one.

Obtain Surface to Surface Constraints ($ssc^{roic}$)

For all pairs of objects in roic+$a^r$ and their relevant surfaces, the present invention retrieves the constraints from the surface-to-surface constraints knowledge base (SSSC-KB).

Obtain the Most Probable Activity Regions (mpar) for the Requesting Agent $a^r$

Figure 5:
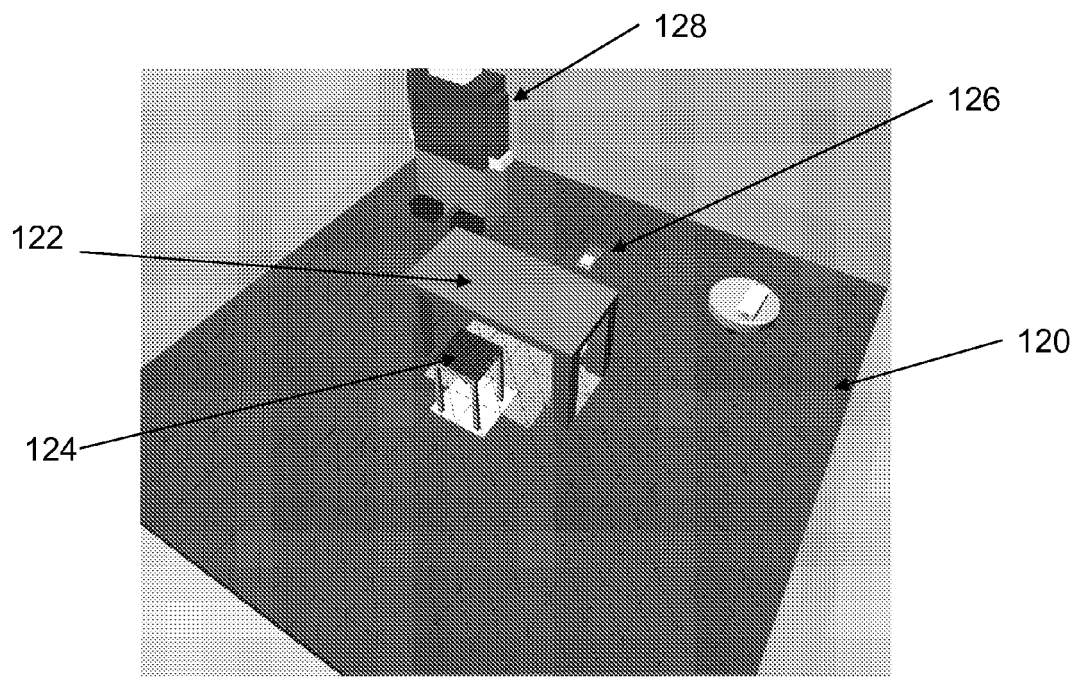
FIG. 5 shows an example rendering of objects in connection with a method for determining a most probable activity station in accordance with one embodiment of the present invention.

The most probable activity regions are those regions on the cas where $a^r$ is most likely to be located to efficiently interact with all the objects covering role's. To compute this, the present invention places a grid of cells over cas called the cas-grids. In the example rendering of objects in FIG. 5, the grid is illustrated at 120, along with a table 122, chair 124, phone 126 and agent 128. The present invention can control the cas-cell size in a cas-grid with a parameter, with a smaller size representing a finer degree of control for placement. It will be appreciated, however, that a smaller cell size exponentially increases the computation time and needed computing resources. Next, for each object $o^t$ in roic, the present invention places $a^r$ at the object and votes on the cells in the grid. First, if the cas-cell is located on an activity station (e.g., seat of a chair), then it gets a high positive vote (e.g., +5). Next, if a cas-cell is reachable from a voting object $o^v$ in roic, then if they are not supposed to be associated with the same activity station, then to prevent a common activity station, $o^v$ casts a large negative vote of (e.g., −100) on the cas-cell or else it casts a positive vote of v (e.g., +1). For example, a printer may not share the same activity station as a laptop. In that case, this approach ensures that a printer and a laptop are not placed together. Also, if $o^v$ is of the same kind as $o^t$, and the cardinality constraint for the $o^v$ for the station is 1, then it casts a large negative vote (e.g., −100) to prevent using the same activity station. The present invention then totals the votes for each cas-cell in the grid into a cas-cell-score.

Obtain the Most Probable Placement Regions (mppr) for $o^t$

Figure 6:
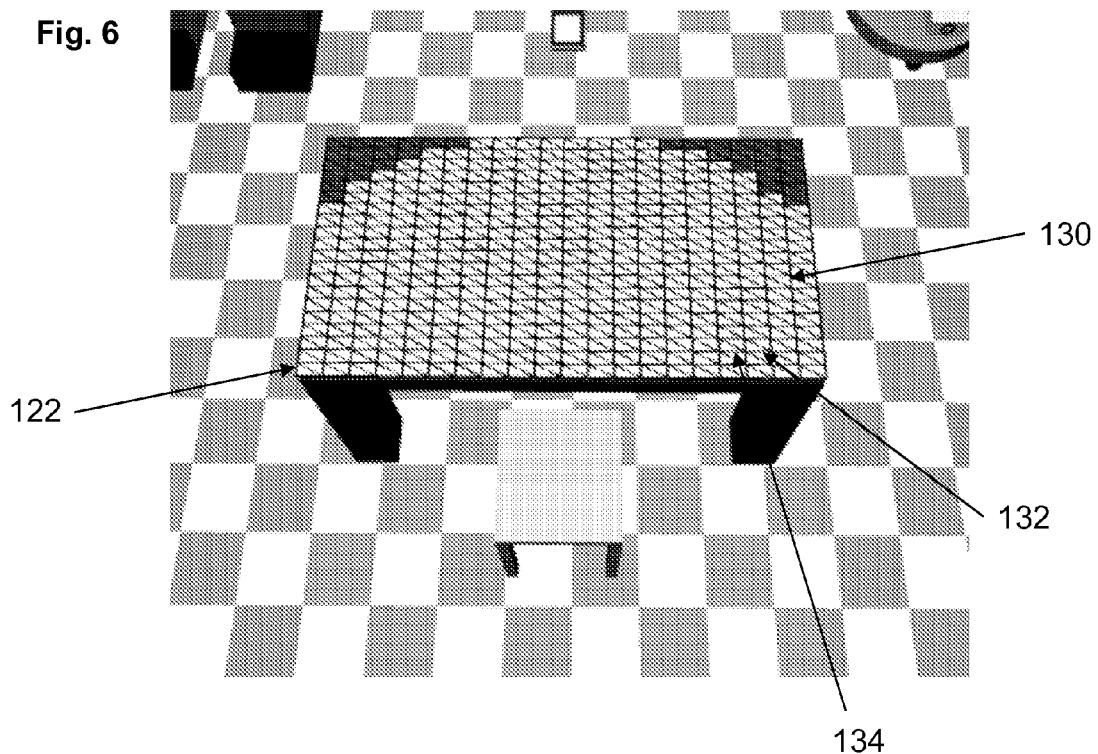
FIG. 6 shows an example rendering of objects within a virtual environment in connection with a method for determining most probable placement regions in accordance with one embodiment of the present invention.

The most probable placement regions are those where the target object $o^t$ may be placed to satisfy $a^r$'s linguistic directive. The present invention computes the mppr as follows. First, the present invention places grids on each of the cps's, i.e., cps-grid 130 on table 122, as shown in FIG. 6, for example. Next, from each cas-cell (e.g., 132, 134), the present invention votes on all the cells (i.e., cps-cell) in the cps-grids. If a cps-cell is reachable from a cas-cell then the cas-cell votes on the cps-cell with its cas-cell-score. All of the relevant objects in roic also vote on a cps-cell based on their interaction constraints with the $o^t$. If a cps-cell is located on an $o^v$, and as determined if, $o^v$ and $o^t$ are of the same category and, if the category is a self-category attractor for the given intent, then the cps-cell gets a large positive vote (e.g., +20). For example, a book attracts a book to be placed together. Since many cas-cells can vote on a cps-cell, the present invention retains the maximum positive vote as the cps-cell score. The constraints are available in $ssc^{roic}$ that were obtained as described above. It will be appreciated that an object in roic can cast a negative vote if it needs to prevent placement to maintain visibility. For example, a projector may cast a negative vote in front for every object other than a projection screen. All placement cells with votes more than a certain pre-determined threshold are included in the mppr. In one embodiment of the present invention, upon selecting the placement area/cell with the highest score, the present invention has thus determined a valid location and a final placement area for the given object. The present invention can thus proceed with placing the object on, in or at the selected placement area. The object can be provided with a default orientation, or the present invention can further operate to assess the preferred orientation of the object before placing it as described below.

Obtain the Preferred Geo Orientations (go) for the $o^t$

Figure 7:
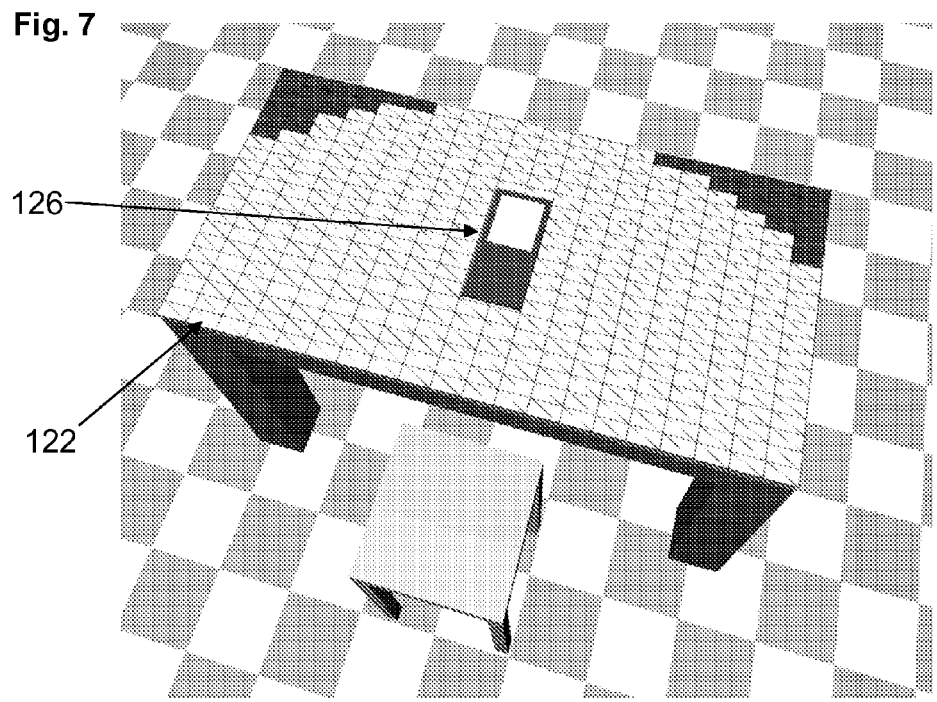
FIG. 7 shows an example rendering of objects within a virtual environment in connection with methods for determining a most probable interactive orientation and for determining a complete object placement in accordance with embodiments of the present invention.

The present invention selects the preferred geo-orientation of the $o^t$ using its surfaces for a given intent from $ssc^{roic}$. Using this, the present invention sets the geo-orientation of the target object surface. For example, a book face faces up. As shown in FIG. 7, the phone 126 is placed screen-side up on the table 122.

Obtain the Most Probable Interactive Orientation (mpio) for the $o^t$

The most probable interactive orientations of the target object surfaces are those that conform to the various orientation constraints such as visibility and readability from the activity regions as imposed by the constraints in $ssc^{roic}$. To obtain the mpio, for each mppr, in one embodiment of the present invention, the system of the present invention begins with an orientation in the horizontal plane that aligns the axis of an object to the edge of the placement surface, rotates it by an increment of some angle alpha (e.g., 45 degrees) and checks for the applicable constraints with all the objects. If all of the constraints are satisfied, then the orientation is selected as one of the placement constraints.

Obtain a Final Placement and Orientation (fpo)

In one embodiment, the present invention scores the mppr-mpio outputs and picks the one with the highest score. Upon selecting the output with the highest score, the present invention has thus determined a valid location and a final placement area and orientation for the given object. In FIG. 7, for example, the phone 126 is placed in the approximate middle of the table 122. It will be appreciated that the final placement need not be axially aligned with a given surface. For example, a rectangular-shaped book object to be placed on a rectangular shaped table need not have one or more edges aligned with or parallel to one or more edges of the table. In this way, the present invention can adapt to situations in three-dimensional virtual worlds that require placement of objects in a non-axes aligned manner. It will further be appreciated that the present invention need not determine both a placement location and a placement orientation at the same time. For instance, the present invention may determine a valid placement location as described above, and proceed to place the object in the valid placement location within the virtual world without regard to the orientation of the object, or only with regard to a pre-determined orientation.

Placement Knowledge Representation

As described above, the object placement algorithm according to the present invention uses a variety of context-free and context-dependent knowledge of objects and their interactions with each other and the reference agent $a^r$. As described herein, the present invention can further define the inventory of concepts that forms the basis for encoding the knowledge used by the object placement algorithm of the present invention. These concepts serve as the language to encode spatial constraints for interacting object in the knowledge base. A description of the structure and the content of the knowledge base in accordance with one embodiment of the present invention is provided hereinafter.

Concepts for Spatial Relations Constraints Specification
Reference Human Agent ($a^r$)

The present invention employs functional representation of objects in the world and no functional representation is feasible without a reference agent according to the present invention. In one embodiment of the present invention, a reference human agent is the requester for whom the object placement is being considered. Further, in one embodiment, the present invention considers different properties of a human agent for describing placement constraints, such as, for example, age, gender, pose and placement intention. Age determines the size and therefore the reach of the agent. In one embodiment, the present invention uses adult, youth, child, and infant as the variable labels. Gender helps determine the size and the reachability parameters for the agent. In one embodiment, the present invention uses male and female as the values. Sitting, standing and lying down are examples of principal poses used in accordance with the present invention. Other poses such as squatting and stretching can be employed as well. Placement intention is described in more detail below.

Qualitative Height: In one embodiment, the present invention describes the height of a surface from the floor using qualitative descriptions by reference to the requesting agent. In one embodiment of the present invention, the height is measured from the floor on which the reference agent is standing. In one embodiment, the present invention considers the following two parameters based on the $a^r$ characteristics.

1. Agent type: Adult, Youth, Child, infant.
2. Height: face, shoulder, waist, knee, floor and ceiling.

For example, the placement preference for a chair is floor, and placement preference for printer would be waist/knee-Adult. The qualitative placement height for a picture or poster is face-adult. Similarly, the placement location preference for a chandelier is ceiling.

Intention Description

The intention or purpose of the reference agent $a^r$ has an impact on where the object should be placed when the directives are underspecified. In one embodiment, the present invention considers the following four category labels:

1. use: This is when the agent intends to use the object. This is the default scenario. For example, a chair is available for sitting is the direct use. For usage it must be upright. However, for storage it need not be upright.
2. store: This is when the agent intends to store the object for safe keeping for later use. Certain objects may need to be placed for safekeeping, protection and/or storage. For example, chairs may be stacked up when not used. Spoons and forks may have other requirements when not intended for use.
3. maintain: This is a situation when the reference agent intends to perform maintenance on the object. The object may be placed at certain locations for maintenance. For example, unclean forks and cups may be placed in the dishwasher.
4. build: This is a situation where the reference agent intends to use it for building another object.

The handedness description of an agent (i.e., whether the agent is right-handed or left-handed) can have an impact on where an object should be placed.

Physical Objects and Properties

Physical objects comprising their 3-D shape occupy space in the virtual worlds in accordance with the present invention. These objects have various individual and context specific spatial properties. The object can be composed of parts, each of which may have properties associated with it. In accordance with the present invention, one of the important spatial properties is the frame of reference associated with an object.

Frame of Reference and Intrinsic Frame

The frame of reference comprises three orthogonal axes in a coordinate system. In one embodiment, the present invention denotes the three axes with letters X, Y, and Z, where nominally Z is vertical. Each axis has directions + and − depending on the direction it extends from the origin. In one embodiment, the present invention uses the following axes description labels (e.g., see FIG. 8):

X-axis: X +, −
Y-axis: Y +, −
Z-axis: Z +, −

For some objects, one of these axes may be marked as the major axis. For example, cylindrical long objects such as pens and pencils may have a major or principal axis (e.g., X) along their length. Some objects have a dominant intrinsic frame of reference depending on their shape and function in the world. For objects with a dominant frame of reference, the present invention permits the selection of the object's frame of reference or else it uses the $a^r$ frame of reference. For example, a chair may have a front, back, top, bottom, left and right, regardless of the context. Some objects can be symmetrical about 1, 2, or 3 axes and may not have an unambiguous intrinsic frame. However, most functional objects do have a strong intrinsic frame.

Object Intrinsic Parts

In one embodiment, the present invention subdivides an object's geometric 3D-extent into its logical parts or features. The features considered are point, lines or curves, surfaces or regions, and volumes in 0, 1, 2 and 3 dimensions respectively. In one embodiment, the associated part names are tip, edge, side, and corner (See Table 1). Other features such holes and groves can be considered as well.

TABLE 1

| Geometric Extent | # Dim | Part Name |
|---|---|---|
| Point | 0 | Tip |
| Lines/curves | 1 | Edge |
| Surfaces/Regions/Areas | 2 | Side |
| Volumes | 3 | Corner |

Figure 8:
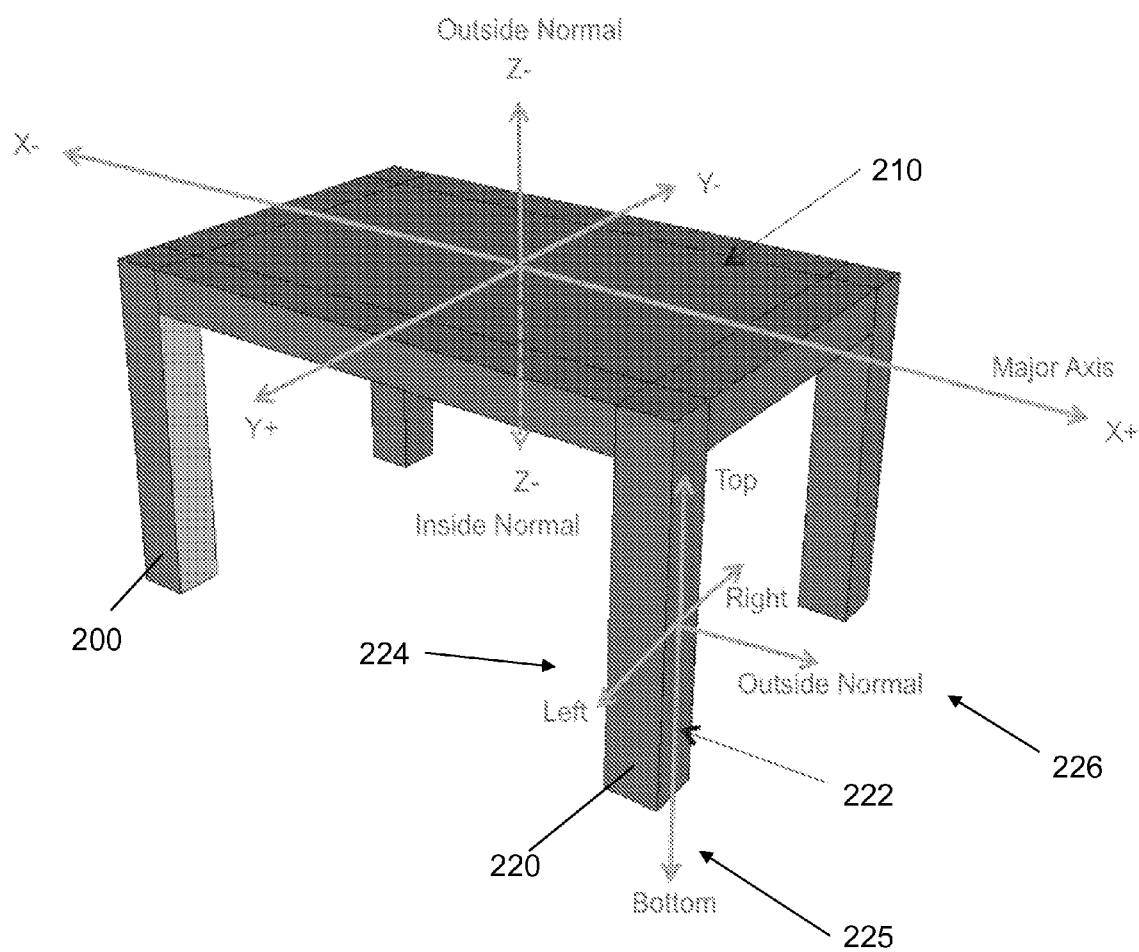
FIG. 8 shows an example rendering of objects within a virtual environment, including reference axes in accordance with one embodiment of the present invention.

As shown in FIG. 8, for example, the table 200 includes a table top 210 and legs 220. The table top 210 has a top surface

212, a major axis X– to X+, a minor axis Y– to Y+ and vertical axis Z– to Z+. The Z– portion of the vertical axis is referenced as "inside normal" as it extends inside of the origin. The Z+ portion is referenced as "outside normal" as it extends outside of the origin. Similarly the table leg 220 has a face 222 with a left-right axis 224, a vertical "top-bottom" axis 225 and an axis with an "outside normal" direction 226.

Pose

Objects that have parts that move relative to each other may have their spatial configurations referred by a pose label in accordance with one embodiment of the present invention. For example, a desk lamp's stem may have several configurations that may have names. Similarly, human-like agents have various poses such as walking, sitting, and stretching, for example. Certain objects such as doors and windows may have spatial-functional configurations such as open-closed and locked-unlocked in accordance with the present invention.

Activity Station

In accordance with the present invention, some objects, such as a chair, for example, are activity stations and the present invention marks them as such in the knowledge base. The activity station cardinality limits the number of objects of a particular type that may be associated with an activity station. For example, only one computer or one printer may be associated with an activity station. Some objects attract the same category of object. For example, books and magazines may attract each other. Some objects may contain or support other objects. For example, a table top supports other objects. Objects with spatial functions may have a default intent associated with them. For example, a table top has a default intent of "use", while a book shelf has a default intent of "storage". Some objects are installable and can be affixed to other objects. For example, a picture may be hung on the wall.

Surface, its Properties, and Spatial Representations

In accordance with one embodiment of the algorithm of the present invention, surfaces are the most relevant geometric extent of 3-D objects. In one embodiment, the present invention reduces the interaction between two objects to interaction between two surfaces of the respective objects. For example, "bottom book cover face" may interact with the face of a table top. For an object with a dominant intrinsic frame, its surfaces may be identified by reference to the object's intrinsic frame. For example, a surface may take on one of the following intrinsic labels: top, bottom, left, right, front and back. In one embodiment of the present invention, each surface has the following two normals (e.g., see FIG. 8):

1. Outside normal: this is the normal vector to the plane of the surface that points outwards. This is the z+ of the surface intrinsic frame
2. Inside normal: This is the normal vector to the surface that points inwards toward the material of the object. This is the z– of the intrinsic frame Further, each surface can be provided with the following four intrinsic axes (e.g., see FIG. 8):

1. Top: This refers to intrinsic y+ of the surface if applicable
2. Bottom: This refers to the intrinsic y– axis of the surface
3. Left: This refers to the intrinsic x– axis of the surface
4. Right: This refers to the intrinsic x+ axis of the surface In one embodiment, the present invention represents the geo-orientation of a surface by the tuple <object surface, surface axes, geo-orientation labels>, where the geo-orientation labels are:

1. up: This is outside normal of the Earth surface or z+, i.e., the direction against gravity
2. down: This is inside normal of the Earth surface or z–, i.e., the direction of gravity.

In one embodiment, the present invention represents a table top facing up as <table.top, outside normal, up>.

In one embodiment, the present invention represents the relative orientation of two surfaces by the following relation: <targetobject.surface, referenceObject.surface, planar-axes-alignment, normal-axes-alignment>; where targetObject.surface and referenceObject.surface refer to candidate surface whose relative orientation is specified and the planar-axis-alignment and the normal-axes-alignment are as follows:

1. Planar-axes-alignment: This is a tuple of two planar axes, each selected from the two different surfaces that are aligned (i.e., they have the same unit vector). For example, <top, top>.
2. normal-axes-alignment: This is a tuple of two normal axes, each selected from the two different surfaces that are aligned (i.e., they have the same unit vector). For example, <outside-normal, inside-normal>.

Therefore, in one embodiment, the present invention represents the relative constraint of an agent facing a picture as follows: <agent.camera.face, picture. front, <top,top>, <outside,inside>>

The distance between two surfaces is the minimum distance between a pair of points located on the two different surfaces. In one embodiment, the present invention uses the following labels to qualitatively describe the distances:

1. touching: that is, the distance between the two objects is 0.
2. reachable: that is, the distance between the two object is <=reach of the reference agent $a^r$.

In one embodiment, the present invention describes the visibility of a surface from another using the following labels:

1. completely-clear: This implies that the all points on the target surface are visible from all the points on the other surface.
2. partially clear: This implies that only some points in the target surfaces are visible from any point on the other surface
3. completely occluded: This implies that none of the points on the target surface is visible form any point in the source surface.

In one embodiment, the present invention describes a surface height by reference to reference agent's physical characteristics such as floor, knee, waist, abdomen, check, neck, and head, for example.

In one embodiment, the algorithm of the present invention uses the following knowledge bases: Object Knowledge Base (O-KB); Agent Database (A-DB); Agent Object Relation Database (AOR-DB); Object to Object Activity and Distance Constraints Knowledge-Base (OOADC-KB); and Surface to Surface Spatial Constraints Knowledge Base (SSSC-KB).

The O-KB contains various context-free properties of an object. In one embodiment of the present invention, each record in the O-KB contains the following information for a category of object:

1. Object type: The type of object for which the preferences are recorded.
2. Object spatial function: This can be represented with a value of contain, support, or none, for example.
3. Default Intent: This is the default agent intent associated with objects supported or contained in the object.
4. Self-category attractor: This is provided with a value of either true (yes) or false (no).
5. Activity Station: This is provided with a value of either true (yes) or false (no).
6. Activity Station Cardinality: This takes a value of 1, n or unlimited.

7. Installability: This takes a value of true or false to indicate whether the object can be affixed to another object. For example a picture or poster is installable.

TABLE 2

Example O-KB Records for book, chair, and picture frame

| Feature | Book | Chair | Picture Frame |
|---|---|---|---|
| Object Type | Book | Chair | Picture Frame |
| Spatial Function | Support | Support | None |
| Default Intent | Use | Use | Use |
| Self-Category Attractor | Yes | No | No |
| Activity Station | No | Yes | No |
| Activity Station Cardinality | N | 1 | 1 |
| Installability | No | No | Yes |

The Agent Database (A-DB) holds the characteristics of a particular instance of an agent. Each record in this database can contain, for example, the following information for an instance of an agent:
1. Agent id: The unique identification of the agent in the world.
2. Handedness: This takes the value right or left.
3. Gender: This takes the value male or female.
4. Height: This is the height of the agent, which can be used by the system to compute height and reach parameters in accordance with the present invention.

TABLE 3

Example records in an agent data base

| Feature | Joe | Sally |
|---|---|---|
| Agent Id | Joe | Sally |
| Handedness | Right | Left |
| Gender | Male | Female |
| Height | 5' 11" | 5' 6" |

The Agent Object Relation Database (AOR-DB) contains the relationship between specific instances of an object and agent instances. Each record in this database can contain, for example, the following information for each instance of the object and agent in the world:
1. Agent id: the agent the possesses or is affiliated with the said object
2. Object id: the object that is associated with the said agent The Object to Object Activity and Distance Constraints Knowledge-Base (OOADC-KB) contains the object to object relationship and distance constraints based on shared activity stations. Each record in the OOADC-KB can contain, for example, the following information for a pair of object categories:
1. object type 1: The type of the first object.
2. object type 2: The type of the second object.
3. Same activity station: This takes the value of either true (yes) or false (no).
4. distance: the preferred distance between the objects (range).

TABLE 4

Example records in OOADC-KB

| Feature | Record 1 | Record 2 |
|---|---|---|
| Object type 1 | Computer | Computer |
| Object type 2 | Keyboard | Printer |
| Same Activity Station | Yes | No |
| Distance | n/a | Farthest |

The Surface to Surface Spatial Constraints Knowledge Base (SSSC-KB) stores the various spatial constraints between two surfaces, which include height preferences, geo-orientations, planar orientations and distances. Each record of this KB can contain, for example, the following information fields:
1. Intent: This provides the agent intent context.
2. Object surface: The surface of the target object for which the constraints are specified.
3. Landmark surface: The surface that is the reference for the constraints.
4. Object surface height preference: The placement preference for the surface height of the object.
5. Geo-orientation norm reference: The reference norm of object and landmark surfaces for which the geo-orientation values are specified.
6. Object surface geo-orientation: The orientation of the object surface with respect to Earth's axes.
7. Landmark surface geo-orientation: The orientation of the landmark surface with respect to Earth's axes.
8. Surface to surface orientation: The relative orientation of the object surface with respect to the landmark surface.
9. Surface to Surface distance: The distance of the object surface from the target surface.
10. Surface to surface visibility: The visibility of the object surface from the target surface.

TABLE 5

Example Surface to Surface Spatial Constraints for a Book

| Feature | book.frontcover | book.back-cover |
|---|---|---|
| Intent | use | use |
| Object surface | book.frontcover | book.back-cover |
| Landmark surface | agent.face | use |
| Object surface height preference | knee and above | No |
| Geo-orientation norm reference | n/a | outside |
| Object surface geo-orientation | n/a | down |
| Landmark surface geo-orientation | n/a | up |
| Surface-to-surface orientation | <top-top,outside-inside> | n/a |
| Surface-to-Surface distance | readable | touch |
| Surface-to-surface visibility | clear | Na |

The invention may be embodied in other specific forms without departing from the spirit or essential characteristics thereof. The present embodiments are therefore to be considered in all respects as illustrative and not restrictive, the scope of the invention being indicated by the claims of the application rather than by the foregoing description, and all changes which come within the meaning and range of equivalency of the claims are therefore intended to be embraced therein.

The invention claimed is:

1. A system for manipulating virtually displayed objects using a virtual agent represented in a virtual environment, comprising:
    a display;
    at least one input device adapted to receive at least one of speech, gesture, text and touchscreen inputs; and
    a computer processor adapted to execute a program stored in a computer memory, the program being operable to provide instructions to the computer processor including:
        receiving user input via the at least one input device, wherein the user input underspecifies a command for a virtual agent within the virtual environment to use in moving at least one target object in the virtual environment;

interfacing with the virtual environment via the virtual agent;

sensing, by the virtual agent, the at least one object in the virtual environment; and finding at least one valid location for the virtual agent to place the at least one object in the virtual environment, wherein determining at least one valid location includes retrieving a linguistic placement constraint, identifying the virtual agent's intent for a target object, identifying a placement preference for the virtual agent, determining one or more object properties of the target object and determining candidate placement surfaces for placement of the target object, determining at least one candidate activity surface on which the virtual agent is located while interacting with the at least one target object, and, for all candidate placement surfaces and the at least one candidate activity surface, identifying all objects in the virtual environment that are in contact with any of the candidate placement surfaces or the at least one candidate activity surface.

2. The system of claim 1 wherein finding at least one valid location includes retrieving a linguistic placement constraint, identifying the virtual agent's intent for a target object and identifying a placement preference for the virtual agent.

3. The system of claim 1 wherein finding at least one valid location further includes determining one or more object properties of the target object and determining candidate placement surfaces for placement of the target object.

4. The system of claim 1 wherein finding at least one valid location includes determining a candidate activity surface on which the virtual agent is located while interacting with at least one target object.

5. The system of claim 1 wherein finding at least one valid location includes determining one or more object properties of the target object, determining candidate placement surfaces for placement of the target object, determining at least one candidate activity surface on which the virtual agent is located while interacting with the at least one target object, and, for all candidate placement surfaces and the at least one candidate activity surface, identifying all objects in the virtual environment that are in contact with any of the candidate placement surfaces or the at least one candidate activity surface.

6. The system of claim 5 wherein finding at least one valid location further includes determining, for every object identified as being in contact with any of the candidate placement surfaces or the at least one candidate activity surface, an object per station cardinality constraint representing how many objects of the type identified are allowed in a particular activity station, and further determining whether the object is a self-category attractor.

7. The system of claim 5 wherein finding at least one valid location further includes determining, for every pair of objects identified as being in contact with any of the candidate placement surfaces or the at least one candidate activity surface, whether the pair of objects can be co-located within the reach of the same activity stations.

8. The system of claim 5 wherein finding at least one valid location further includes determining any surface-to-surface constraints as between the target object and the candidate placement surfaces.

9. The system of claim 5 wherein finding at least one valid location further includes determining one or more most probable activity regions for the target object among the candidate placement surfaces by placing a grid of cells over the candidate placement surfaces and assigning a score or vote for each cell on the grid.

10. The system of claim 9 wherein finding at least one valid location further includes determining one or more most probable placement regions for the target object among the one or more most probable activity regions.

11. The system of claim 10 wherein the program is further operable to find at least one valid orientation for the at least one target object by identifying one or more most probable interactive orientations of the target object.

12. The system of claim 11 wherein the program is further operable to determine a final placement and orientation for the target object by determining scores for the one or more most probable placement regions and the one or more most probable orientations of the target object.

13. The system of claim 1 wherein the program is further operable to find at least one valid orientation for the at least one target object.

14. The system of claim 13 wherein finding at least one valid orientation for the at least one target object includes selecting a preferred geo-orientation based on one or more surfaces of the target object and an intent of the target object.

15. The system of claim 14 wherein finding at least one valid orientation for the at least one target object includes identifying one or more most probable interactive orientations of the target object.

16. The system of claim 1 wherein the at least one input device is adapted to receive at least two of speech, gesture, text and touchscreen inputs.

17. A computer-implemented method, comprising:

receiving, by a computer engine, user input that underspecifies a command for a virtual agent within the virtual environment to use in moving at least one target object in a virtual environment;

interfacing, via the computer engine, with the virtual environment;

sensing, via a virtual agent associated with the computer engine, the at least one target object in the virtual environment; and determining at least one valid location for the virtual agent to place the at least one object in the virtual environment, wherein determining at least one valid location includes retrieving a linguistic placement constraint, identifying the virtual agent's intent for a target object, identifying a placement preference for the virtual agent, determining one or more object properties of the target object and determining candidate placement surfaces for placement of the target object, determining at least one candidate activity surface on which the virtual agent is located while interacting with the at least one target object, and, for all candidate placement surfaces and the at least one candidate activity surface, identifying all objects in the virtual environment that are in contact with any of the candidate placement surfaces or the at least one candidate activity surface.

18. The method of claim 17, wherein determining one or more most probable activity regions for the target object among the candidate placement surfaces by placing a grid of cells over the candidate placement surfaces and assigning a score or vote for each cell on the grid, determining one or more most probable placement regions for the target object among the one or more most probable activity regions, finding at least one valid orientation for the at least one target object includes identifying one or more most probable interactive orientations of the target object, and determining a final placement and orientation for the target object by determining scores for the one or more most probable placement regions and the one or more most probable orientations of the target object.

19. A system for manipulating virtually displayed objects using a virtual agent in a virtual environment, comprising:
   a display;
   at least one input device adapted to receive at least one of speech, gesture, text and touchscreen inputs; and
   a computer processor adapted to execute a program stored in a computer memory, the program being operable to provide instructions to the computer processor including:
      receiving user input via the at least one input device, wherein the user input underspecifies a command for a virtual agent within the virtual environment to use in moving at least one target object in the virtual environment;
      interfacing with the virtual environment via the virtual agent;
      sensing, by the virtual agent, the at least one object in the virtual environment; and
      finding at least one valid orientation for the virtual agent to place the at least one object in the virtual environment, wherein finding at least one valid orientation includes retrieving a linguistic placement constraint, identifying the virtual agent's intent for a target object, identifying an orientation preference for the virtual agent, determining one or more object properties of the target object and determining candidate orientations for the target object, determining at least one candidate activity surface on which the virtual agent is located while interacting with the at least one target object, and, for the at least one candidate activity surface, identifying all objects in the virtual environment that are in contact with the at least one candidate activity surface.

\* \* \* \* \*

UNITED STATES PATENT AND TRADEMARK OFFICE
CERTIFICATE OF CORRECTION

PATENT NO. : 8,893,048 B2  
APPLICATION NO. : 13/468221  
DATED : November 18, 2014  
INVENTOR(S) : Kalyan M. Gupta Page 1 of 1

It is certified that error appears in the above-identified patent and that said Letters Patent is hereby corrected as shown below:

In the Specification

In column 1, line 9, prior to "Field of the Invention", please insert:
--Government License Rights
This invention was made with government support under Contract No. N00014-10-C-0232, awarded by the Office of Naval Research. The government has certain rights in the invention.--

Signed and Sealed this
Tenth Day of March, 2015

Michelle K. Lee
*Deputy Director of the United States Patent and Trademark Office*